(12) United States Patent
Esposito

(10) Patent No.: US 11,270,819 B2
(45) Date of Patent: Mar. 8, 2022

(54) ELECTRONIC DEVICE AND SURGE HANDLING

(71) Applicants: Eaton Intelligent Power Limited, Dublin (IE); Frederic Vladimir Esposito, Luton (GB)

(72) Inventor: Frederic Vladimir Esposito, Luton (GB)

(73) Assignee: EATON INTELLIGENT POWER LIMITED, Dublin (IE)

( * ) Notice: Subject to any disclaimer, the term of this patent is extended or adjusted under 35 U.S.C. 154(b) by 308 days.

(21) Appl. No.: 16/303,065

(22) PCT Filed: Mar. 30, 2017

(86) PCT No.: PCT/GB2017/050899
§ 371 (c)(1),
(2) Date: Nov. 19, 2018

(87) PCT Pub. No.: WO2017/198991
PCT Pub. Date: Nov. 23, 2017

(65) Prior Publication Data
US 2019/0295750 A1    Sep. 26, 2019

(30) Foreign Application Priority Data

May 19, 2016  (GB) .................................. 1608819.7

(51) Int. Cl.
*H01C 7/12*    (2006.01)
*H01T 4/06*    (2006.01)
(Continued)

(52) U.S. Cl.
CPC ................. *H01C 7/12* (2013.01); *H01T 4/06* (2013.01); *H02H 9/008* (2013.01); *H05K 9/0066* (2013.01); *H02H 9/044* (2013.01)

(58) Field of Classification Search
CPC .......... H02H 9/008; H02H 9/044; H01C 7/12; H01T 4/06; H05K 9/0066
See application file for complete search history.

(56) References Cited

U.S. PATENT DOCUMENTS 1,815,233 A   7/1931 Burke
4,099,216 A   7/1978 Weberg
(Continued)

FOREIGN PATENT DOCUMENTS

DE   19829528 C1   2/2000
WO   99/21332 A1   4/1999
(Continued)

OTHER PUBLICATIONS

Eaton, Surge Protective Devices Introduction, 4 pages, Nov. 1, 2012.
(Continued)

*Primary Examiner* — Rafael O De Leon Domenech
(74) *Attorney, Agent, or Firm* — Stinson LP

(57) ABSTRACT

The present invention provides for an electronic isolator, or barrier, device arranged for receiving field wiring from a field element and further including connection means arranged to receive a surge element for providing surge functionality to the device, and to provide surge protection to the connectivity by way of the field wiring, the device arranged such that the surge element connects to the device and to the said field wiring by way of the said connection means so that operational connection/disconnection of the surge element to the device does not require disconnection of the field wiring from the device.

12 Claims, 5 Drawing Sheets

Figure 1A:
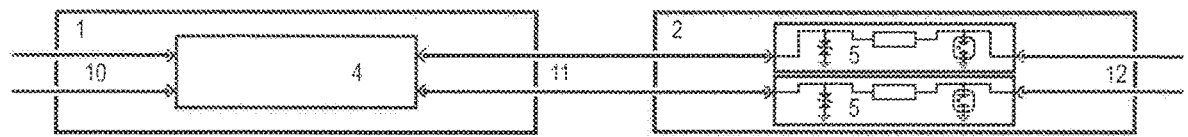

(51) Int. Cl.
   *H02H 9/00* (2006.01)
   *H05K 9/00* (2006.01)
   *H02H 9/04* (2006.01)

(56) References Cited

U.S. PATENT DOCUMENTS

| | | |
|---|---|---|
| 5,144,517 A | 9/1992 | Wieth |
| 5,158,464 A | 10/1992 | Landrini |
| 5,564,086 A | 10/1996 | Cygan et al. |
| 6,384,350 B1 | 5/2002 | Shincovich et al. |
| 2005/0057277 A1 | 3/2005 | Chen et al. |
| 2008/0041930 A1 | 2/2008 | Smith et al. |
| 2010/0067156 A1* | 3/2010 | Lark ............... H02H 9/008 361/57 |
| 2010/0117453 A1 | 5/2010 | Langgood et al. |
| 2011/0149527 A1* | 6/2011 | Esposito De La Torella ............. H02H 9/008 361/730 |
| 2012/0007736 A1 | 1/2012 | Worthington et al. |
| 2015/0229121 A1 | 8/2015 | Davidson |
| 2015/0296598 A1 | 10/2015 | Haid et al. |
| 2016/0226162 A1 | 8/2016 | Emi |

FOREIGN PATENT DOCUMENTS

| | | |
|---|---|---|
| WO | 2004010083 A2 | 1/2008 |
| WO | 2014147093 A1 | 9/2014 |
| WO | 2015/066007 A1 | 5/2015 |

OTHER PUBLICATIONS

Eaton, Surge Protection Solutions for High Energy Surges and Transient Disturbances Capabilities Overview, 22 pages, Aug. 31, 2016.
International Search Report issued for PCT/GB2017/050899 dated Jul. 25, 2017, 3 pages.
Written Opinion issued for PCT/GB2017/050899 dated Jul. 25, 2017, 6 pages.
Paul S. Babiarz, Making Start with the Field Device, Jan. 1, 2005, 20 pages.

* cited by examiner

ELECTRONIC DEVICE AND SURGE HANDLING

CROSS-REFERENCE TO RELATED APPLICATION

This application is a 371 of international of PCT Serial No. PCT/US2017/050899, filed Mar. 30, 2017, which claims the benefit of United Kingdom Serial No. 1608819.7, filed May 19, 2016, the entire contents of which are incorporated herein by reference.

Various forms of electronic device find a wide variety of use in a variety of process industries. In particular, field elements such as sensors and actuators are commonly deployed in field locations within a process environment which, in some instances, can be required to offer appropriate degrees of safety such as explosion-proof characteristics and characteristics of so-called intrinsic safety.

In view of the nature of such deployment, the reliable and safe operation of such field elements is paramount and surge devices are commonly employed as part of the connectivity to the field elements.

Any such surge functionality commonly requires surge protection in particular in relation to connections from the field elements.

Surge devices have commonly been employed so as to provide for such reliable surge-protection functionality.

Electronic devices such as, but not limited to, known field elements commonly connect to appropriate process circuitry relevant to the specific process environment by way of a functional cabinet in which some appropriate electrical functionality, such as zener barrier, isolation, remote I/O or other functionality is provided. Input/output wiring then provides for the appropriate connection to the appropriate process circuitry.

When a plurality of electronic devices are provided in a particular environment, such as a plurality of field elements within a particular process environment, it becomes necessary to make appropriate connections from the field elements to appropriate zener barrier, isolation or other functionality within the function cabinet so that ongoing connections are made to the correct input/output lines leading to the process circuitry.

Routine surge protection functionality for such connections from, for example, field elements, is commonly provided by a separate surge cabinet comprising a plurality of surge elements for connection between the field elements and process circuitry by way of the functional (e.g. zener barrier/isolator) cabinet.

The surge cabinet can be arranged for connection from the field elements by way of an extra marshalling cabinet, generally arranged with marshalling exchange wiring serving to configure the required connectivity of each of the field elements.

When using isolators in particular, it is often necessary to fit surge elements on the outside lines and as noted this can require an additional cabinet and associated additional costs. Space is also required for the additional cabinet within the cabinet room and extensive wiring requirements arise in the cabinet itself requiring careful labour input and cross checking at the time of commissioning of the system and during subsequent fault detection and testing.

A known alternative is to employ a bulky surge module that can be plugging into an isolator device, but this also requires that the field wiring must be disconnected from the isolator and re-connected onto the surge module which of course can prove disruptive, inefficient and inconvenient and can lead to operational problems due to the possibility of incomplete, or incorrect, re-connection.

The potential for the retro-fitting of surges can therefore be limited and it can often be the case that there is no suitable location within the cabinet room for such retro fitting and the required extensive rewiring to achieve such retro fitting can lead to lengthy downtime at the process plant. There is also a likelihood of errors arising in the rewiring connectivity which cannot be ignored or excluded with certainty. Also, the deployment of surge elements in such known manner therefore remains an incentive to employ an additional cabinet with the associated disadvantages noted above.

The present invention seeks to provide for the surge-handling arrangement having advantages over known such arrangements and, in particular, allowing for ready retro fitting in a more simplified, but reliable manner than currently known.

According to a first aspect of the present invention there is provided an electronic isolator device arranged for receiving field wiring from a field element and further including connection means arranged to receive a surge element for providing surge functionality to the device, and to provide surge protection to the connectivity by way of the field wiring, the device arranged such that the surge element connects to the device and to the said field wiring by way of the said connection means The invention proves advantageous insofar as it is unnecessary to disconnect the field wiring from the isolator device in order to fit the surge element and so the principal problems of the known are can be readily avoided. Further it is found that there is no need to provide any additional wiring for the surge element or indeed an additional related housing such as a surge cabinet. The potential for wiring errors that can arise in the current art can therefore be eliminated since it is an inherent feature of the invention that each surge element is clearly associated with the isolator device.

Advantageously, the surge element can therefore be arranged to be removably mounted to the isolator device in a manner requiring no interference with the connection of the device to the field wiring.

In one example, the said connection means is arranged for parallel connection of the surge means with respect to the field wiring. Further, the said connection means can be arranged to connect to the surge device to the field wiring from within the device.

It should be appreciated that the device can comprise an intrinsically safe isolator.

According to another aspect, the present invention can provide for an electronic barrier device arranged for receiving field wiring from a field element and further including connection means arranged to receive a surge element for providing surge functionality to the device, and to provide surge protection to the connectivity by way of the field wiring, the device arranged such that the surge element connects to the device and to the said field wiring by way of the said connection means.

Advantageously, the surge element is arranged to be located at the point of connection of input/output lines to the device. In particular, the said input/output lines in this arrangement comprise field element lines.

It should therefore be appreciated that the electronic functional device can comprise any one or more of, or combination of, a zener barrier device and isolator device In one particular embodiment, the surge element is arranged to be connected to the device by way of any appropriate means such as press-fit means, male/female engagement means and/or screw thread means.

The invention can also provide for a plurality of surge elements associated with a respective plurality of isolator or barrier devices. In this manner, the plurality of devices and their associated surge elements, whether pluggable or not, can be provided as part of the electronic functional device cabinet.

Figure 1B:
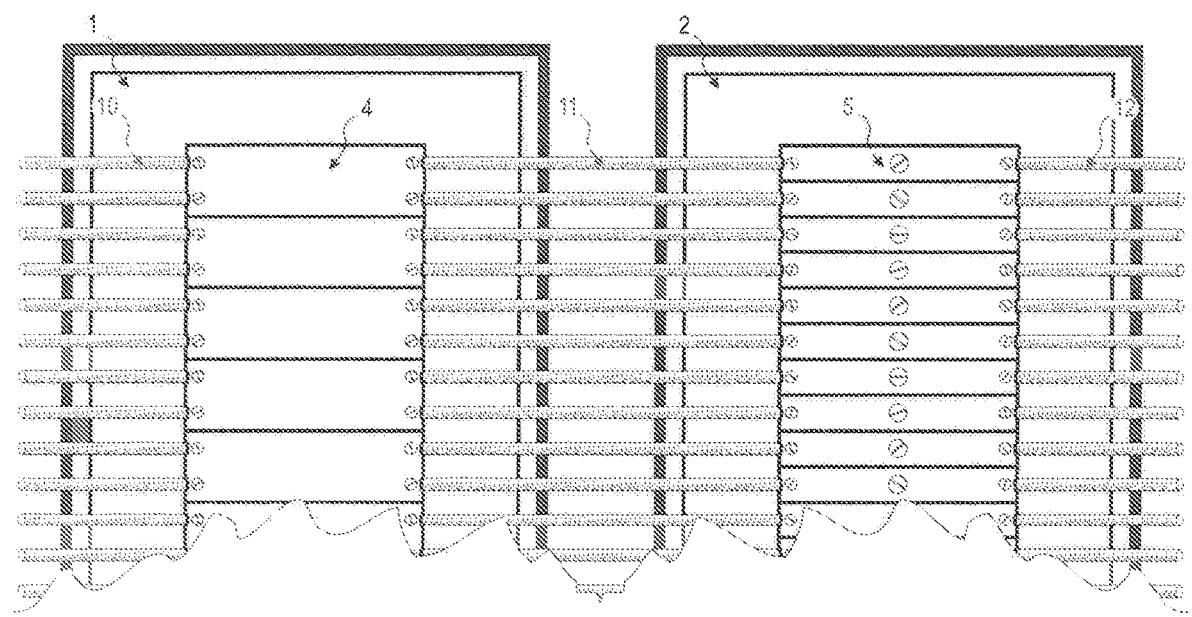
Figure 2A:
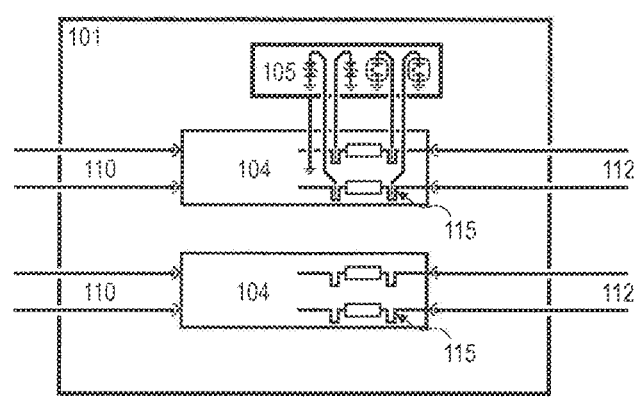
Figure 2B:
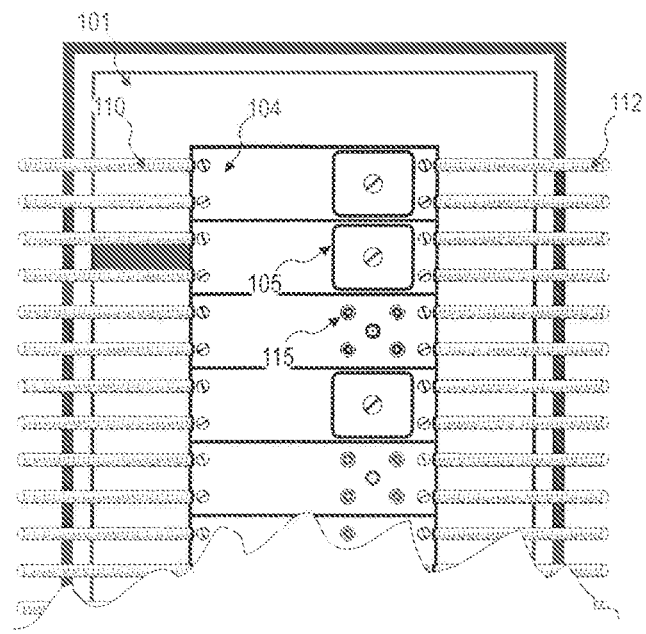
Figure 3A:
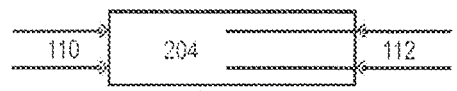
Figure 4A:
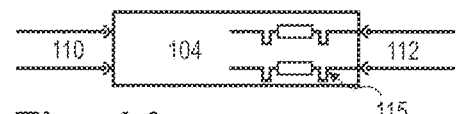
Figure 3B:
Figure 3C:
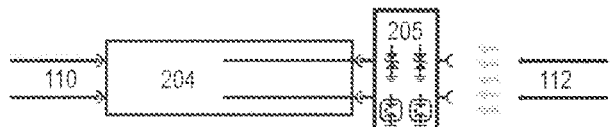
Figure 4B:
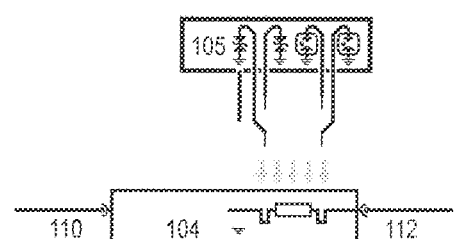
Figure 3D:
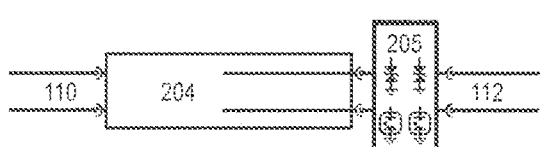
Figure 3E:
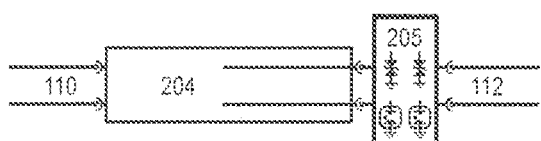
Figure 4C:
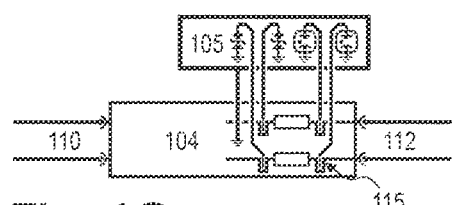

The invention is described further hereinafter, by way of example only, with reference to the accompanying drawings in which:

FIG. 1A is a schematic representation of a known isolator system employing surge-handling functionality;

FIG. 1B comprises a more detailed view of parts of the cabinets of the system of FIG. 1A;

FIG. 2A comprises a schematic block diagram of an isolator cabinet according to an embodiment of the present invention;

FIG. 2B comprises a detailed view of part of the cabinet of FIG. 2A, with the resultant suppression of one cabinet;

FIGS. 3A-3E comprise a series of illustrations of the connection of a surge element to an isolator device as known in the art; and FIGS. 4A-4C comprise a series of illustrations of the pluggable connection according to an embodiment of the present invention.

Turning first to FIG. 1A, there is illustrated an electronic functional cabinet such as an isolator cabinet 1 having isolator elements 4 connected to surge elements 5 located within a surge cabinet 2.

Input/output wiring lines 10 lead from the isolator cabinet 1 to process electronics (not shown) and the connectivity between the isolator cabinet 1 and the surge cabinet 2 is achieved by way of isolator-surge wiring lines 11.

In the illustrated example, onward connection from the surge cabinet 2 is to a plurality of field elements (not shown) by means of surge-field element wiring lines 12. As a further variant but not illustrated in FIG. 1A, the output wiring 12 from the surge cabinet 2 can lead to an additional cabinet, such as a marshalling cabinet to assist with the appropriate configuration of connectivity of the plurality of field elements. Examples of the basic component elements of each surge element 5 are illustrated in this schematic representation of FIG. 1A.

FIG. 1B provides further illustrative detail within each of the isolator cabinet 1 and surge cabinet 2. As can be seen, a plural series of isolator devices 4 are mounted within the isolator cabinet 1 and each connects at input/output sides to the input/output wiring 10 and isolator-surge wiring 11. A corresponding series of surge devices 5 are likewise mounted within the surge cabinet 2, with a separate surge element being provided in relation to each of the isolator-surge lines 11, and each of the surge-field element lines 12.

As clearly illustrated in FIGS. 1A and 1B, the provision of the surge functionality requires the additional cabinet 2 which leads to additional cost and also disadvantageously requires additional space within the cabinet room and leads to additional wiring overheads. The additional cabinet also comprises part of a series connection that must be broken if it is required to change and/or install the surge element, and which disadvantageously results downtime.

Such disadvantageous disconnection etc. also arises in relation to the prior art such as that discussed further below with reference to FIGS. 3A-3E and in which connections must be broken to retrofit the surge element and in a scenario in which an extra cabinet is not required, assuming of course that such relatively large add-ons can fit within the isolator cabinet.

Turning now to FIG. 2A, there is provided a schematic representation of an isolator cabinet 101 according to an embodiment of the present invention.

The isolator cabinet 101 in this example includes isolator functionality 104 connecting, by means of input/output wire lines 110, to process circuitry, and by way of output wire lines 112, to a plurality of field elements. Again such connection to the field elements can be by way of a marshalling cabinet if required.

Also schematically illustrated with reference to FIG. 2A is the provision of one surge element 105 of a possible plurality of pluggable surge elements 105 for providing surge protection from the input/output field line 112 illustrated in FIG. 2A as required. The basic electronic functionality within the pluggable surge element is illustrated schematically in FIG. 2A. As can be appreciated, the presence of the pluggable surge element (105) does not require the removal/reconnection of the field lines 112.

Turning to FIG. 2B, further detail of the configuration of the surge devices 104 within the surge cabinet 101 is illustrated and where each of the pluggable surge elements 105 is illustrated in relation to the isolator elements 104 requiring surge protection.

As noted, each of the isolator elements 104 is provided with an appropriate socket arrangement 115 via which the surge element 105 can be removably plugged into the isolator element 104 as required and electrically connected to the input/output field lines 112 so as to provide for the required surge functionality. Again, and importantly, the operative connection of the surge element to, and disconnection from, the isolator is achieved without requiring any disconnection of the field wiring. This therefore allows for "live" connection/disconnection of the surge element with no, or minimal, need for "downtime".

The advantageous avoidance of a separate surge cabinet can therefore be achieved but without the limitations of the prior art.

The isolator devices 104 are therefore advantageously arranged to accept the pluggable surge elements 105 within their own cabinet 101, and such devices can readily connect exactly where needed in relation to the input/output field lines 112.

Further, the surge element 105 can be plugged-in or removed while a process is running and such configuration provides immediate indication as to which of the input/output field lines 112 is associated with a surge device. The simple pluggability also avoids the need for additional, fault prone, wiring, in addition to avoiding the need for the separate surge cabinet as noted above. Yet further, retrofitting of such pluggable surge elements/modules 105 can also readily be achieved as required.

Referring now to FIGS. 3A-3E there is shown, in series format, the manner of connection of a surge element to an isolator device and as known in the current art.

Referring first to FIG. 3A, there is illustrated input/output lines 110 connecting to an isolator device 204 which connects in turn to output wire lines 112 in this example comprising field wiring 112. In order to achieve the introduction of surge functionality according to this known art, it is necessary that the field wiring 112 be disconnected from the isolator device 204 as illustrated in FIG. 3B so as to allow for the insertion, in serial fashion, between the isolator device 204 and the field wiring 112, a surge element module 205 and as illustrated with reference to FIG. 3C.

FIG. 3D shows the next stage in the procedure in which the surge element 205 is first connected to the isolator device 204 and then, as illustrated in FIG. 3E, the field wiring 112 is then connected in turn to the surge element 205. Accordingly, the previously disconnected field wiring 112 no longer makes direct connection to the isolator device 204, but rather now connects to the surge element 205 serving as an intermediate element between the field wiring 112 and the isolator device 204.

As will be appreciated, such operational fitting of the surge element 205 has required the disconnection, and subsequent reconnection, of the field wiring 112 which exhibits a wide variety of disadvantages but least of which comprise disruption and downtime to the operation of the system employing the wiring and isolator device, but also opens the potential for further disruption if such disconnection cannot be reversed in a relatively simple and efficient manner.

Turning now to an example of the present invention as illustrated with reference to FIGS. 4A-4C particular advantage of the present invention will be readily apparent.

Turning first to FIG. 4A, an isolator device 104 according to an embodiment of the present invention is connected to input/output wire lines 110 and field lines 112 as with the prior art configuration. However, as an important difference, the isolator 104 includes connection means 115 allowing for the connective plugability of a surge device 105 directly into the isolator 104 and without requiring any disruption to the connection of the isolator device 104 to the field wiring 112.

This advantageous feature of the present invention is illustrated further with reference to FIG. 4B illustrating a suitable surge device 105 arranged for insertion into the connector arrangement 115 of the isolator device 104. As will then be appreciated, such connection is quite independent of the nature of the connection between the isolator 104 and the field lines 112.

FIG. 4C completes the illustration of the connection process and illustrates the surge element 105 plugged into the connector 115 of the isolator device 104 so as to effectively achieve parallel connection within the isolator device 104 and with respect to the field wiring 112 for operative connection thereto.

As will be readily appreciated, the surge can be plugged/unplugged, i.e. connected/disconnected as many times as appropriate and, on each occasion, there is no effect on the manner of connection between the isolator device 104 and the field wiring 112 and thus very little, if any, disadvantageous effect on the operation of the system employing the isolator device 104 since "live plugability" can be achieved between the surge element 105 and the isolator device 104 without requiring any downtime.

The present invention therefore provides for a particularly advantageous and simplified manner of connection of a surge element to an operational device such as an isolator device and which further enhances manner in which such surge functionality can be provided without requiring a separate surge cabinet.

Of course, it will be appreciated that the present invention is not restricted to the details of the foregoing embodiments. In particular, it is envisaged that the invention be provided in relation to any form of isolator, with offering intrinsic safety or otherwise, or indeed any form of barrier device, such as a zener barrier device.

While the above mentioned embodiment of the invention is discussed in relation to an electronic functional device, and device cabinet, in the form of an isolator device and cabinet, it should be appreciated that the invention can be readily provided in relation to zener barrier devices and zener barrier cabinets or indeed a combination thereof.

The invention therefore is not restricted to the details of the forgoing embodiments particularly as regards the nature of connection/disconnection of each of neither the surge elements 105 nor their component parts.

The invention claimed is:

1. An electronic isolator device arranged for receiving field wiring from a field element, the electronic isolator device comprising:
    a connector configured to receive a surge element for providing surge functionality to the electronic isolator device, and to provide surge protection to the connectivity by way of the field wiring, the connector configured to connect the surge element to the electronic isolator device and to the field wiring, wherein the connector is arranged for parallel connection of the surge element with respect to the field wiring, wherein the field wiring extends directly from the electronic isolator device.

2. The electronic isolator device as claimed in claim 1, wherein the connector connects the surge element to the field wiring from within the device.

3. The electronic isolator device as claimed in claim 1, further comprising an intrinsically safe isolator.

4. An electronic barrier device arranged for receiving field wiring from a field element, the electronic barrier device comprising:
    a connector configured to receive a surge element for providing surge functionality to the electronic barrier device, and to provide surge protection to the connectivity by way of the field wiring, the connector configured to connect the surge element to the electronic barrier device and to the field wiring, wherein the connector is arranged for parallel connection of the surge element with respect to the field wiring, wherein the field wiring extends directly from the electronic isolator device.

5. The electronic barrier device as claimed in claim 4, further comprising a zener barrier device.

6. The electronic barrier device as claimed in claim 4, wherein the connector is configured to provide visual indication of the electronic barrier device protected by the surge element when the surge element is received by the electronic barrier device.

7. The electronic barrier device as claimed claim 4, wherein the connector is configured to connect to the surge element by way of a press-fit connection.

8. The electronic barrier device as claimed in claim 4, wherein the connector is configured to connect to the surge element by way of a male/female connection arrangement.

9. The electronic barrier device as claimed in claim 4, wherein the connector is configured to connect to the surge element by way of a threaded connection.

10. The electronic barrier device as claimed in claim 4, wherein the connector is configured to locate the surge element at the point of connection of the electronic barrier device to field wiring.

11. The electronic barrier device as claimed in claim 4 in combination with one or more additional electronic barrier devices to form an electronic system element.

12. The electronic barrier device as claimed in claim 4 in combination with an electronic functional device cabinet.

* * * * *